United States Patent
Patti

(10) Patent No.: US 6,373,767 B1
(45) Date of Patent: Apr. 16, 2002

(54) MEMORY THAT STORES MULTIPLE BITS PER STORAGE CELL

(76) Inventor: Robert Patti, 1 S. 751 Avon Dr., Warrenville, IL (US) 60555

( * ) Notice: Subject to any disclaimer, the term of this patent is extended or adjusted under 35 U.S.C. 154(b) by 0 days.

(21) Appl. No.: 09/689,496

(22) Filed: Oct. 11, 2000

Related U.S. Application Data

(63) Continuation-in-part of application No. 09/417,040, filed on Oct. 12, 1999, now Pat. No. 6,154,392, which is a continuation-in-part of application No. 09/476,625, filed on Dec. 31, 1999, now Pat. No. 6,141,261.

(51) Int. Cl.$^7$ .............................................. G11C 7/02
(52) U.S. Cl. ................ 365/210; 365/185.2; 365/189.01
(58) Field of Search ..................... 365/185.2, 189.04, 365/189.07, 210, 189.01

(56) References Cited

U.S. PATENT DOCUMENTS 5,880,988 A * 3/1999 Bertin et al. .................. 365/63
5,883,827 A * 3/1999 Morgan ....................... 365/100

* cited by examiner

*Primary Examiner*—David Nelms
*Assistant Examiner*—Thong Le
(74) *Attorney, Agent, or Firm*—Calvin B. Ward

(57) ABSTRACT

A multi-level memory in which each storage cell stores multiple bits. The memory includes a plurality of storage words, a data line, a plurality of reference lines, and a read circuit. Each storage word includes a data memory cell and a plurality of reference memory cells. A stored charge determines a conductivity value measurable between the first and second terminals of each memory cell. The read circuit generates a digital value indicative of the value stored in the data memory cell of a storage word that is connected to the data and reference lines by comparing the conductivity of the data line with a continuous conductivity curve determined by the conductivities of the reference lines.

8 Claims, 5 Drawing Sheets

US 6,373,767 B1

MEMORY THAT STORES MULTIPLE BITS PER STORAGE CELL

RELATED APPLICATIONS

This patent is a continuation in part of U.S. patent application Ser. No. 09/417,040, filed Oct. 12, 1999, now U.S. Pat. No. 6,154,392 and U.S. patent application Ser. No. 09/476,625, filed Dec. 31, 1999, now U.S. Pat. Ser. No. 6,141,261.

FIELD OF THE INVENTION

The present invention relates to memory systems, and more particularly, to memory architectures that allow multiple bits to be stored in each memory cell.

BACKGROUND OF THE INVENTION

Dynamic random-access memories (DRAMs) provide the bulk of the semiconductor-based memories on most computer systems. A DRAM stores data in the form of charge that is stored on a capacitor within the memory cell. The current commercially available DRAMs store one bit in each memory cell, which consists of a transistor and a capacitor. The cost per bit stored is determined by the size of the memory cell. Hence, the prior art has achieved cost reductions in DRAMs by reducing the size of the transistor and capacitor.

A second method for reducing the cost of DRAM storage is to utilize memory cells that can store multiple bits per memory cell. To store N bits per memory cell, each memory cell must provide $2^N$ discrete distinguishable states. In general, the states correspond to the charge stored on a capacitor. The maximum number of bits that can be stored depends on the sensitivity of the circuits used to measure the stored charge and on the ability of the write circuits to precisely control the amount of charge that is stored on the capacitor. Prior art multilevel DRAMS have been limited to two or three bits per storage cell.

The amount of charge that leaks off of the capacitor is a non-linear function of the amount of charge that was stored on the capacitor during programming. To compensate for the charge leakage, reference cells that are written at the same time as the storage cells are programmed with predetermined data values. Hence, the size of a "word" that stores M bits of data must be increased by the number of reference cells needed to read the data in that word. At the time the data is read from the storage cells, it is compared to the values in the reference cells. If the number of storage levels is relatively small, a reference cell can be included for each possible data value. However, this strategy fails if the number of storage levels is high. For example, if each storage cell stores 8 bits, than each word would require 256 reference cells. Any savings realized by storing multiple bits per memory cell would be consumed by the additional reference cells. U.S. patent application Ser. No. 09/476,625, referenced above, describes a DRAM memory that utilizes reference cells to correct for charge leakage while keeping the number of reference cells to a reasonable number.

Multi-level EEPROM memories also suffer the leakage problems discussed above, but to a much lesser extent. In a multi-level EEPROM cell, data is stored by storing charge on a floating gate, the amount of charge stored controls the conductivity of the channel between the source and drain of a transistor. The number of different states that can be stored on a single transistor depends on the accuracy with which the charge level can be set and the accuracy with which the stored charge level can be read. While the leakage rate of charge from the floating gate is small, it is still significant enough to reduce the number of bits that can be stored in the transistor if corrections are not made for this leakage. U.S. patent application Ser. No. 09/417,040, referenced above, describes an EEPROM memory that utilizes reference cells to correct for charge leakage.

Broadly, it is the object of the present invention to provide an improved multilevel memory.

It is a further object of the present invention to provide a memory that does not require one reference cell per storage level.

These and other objects of the present invention will become apparent to those skilled in the art from the following detailed description of the invention and the accompanying drawings.

SUMMARY OF THE INVENTION

The present invention is a memory that includes a plurality of storage words, a data line, a plurality of reference lines, and a read circuit. Each storage word includes a data memory cell and a plurality of reference memory cells. Each memory cell includes an isolation transistor and a storage element having first and second terminals for storing a charge. The stored charge determines a conductivity value measurable between the first and second terminals. The isolation transistor is connected to the first terminal and connects the first terminal to one of the lines. The first terminal of the data memory cell is connected to the data line, and the first terminal of each of the reference memory cells is connected to a corresponding one of the reference lines when the isolation transistors are in a conducting state. The isolation transistors are placed in the conducting state by a signal on a word line connected to each of the isolation transistors in the storage word. The read circuit generating a digital value indicative of the value stored in the data memory cell of a storage word that is connected to the data and reference lines by comparing the conductivity of the data line with a continuous conductivity curve determined by the conductivities of the reference lines. In one embodiment of the invention, the conductivity curve is a piece-wise linear curve, having linear segments determined by the conductivities of the reference lines. Data is written into a storage word by a write circuit that causes a charge determined by an input digital value to be stored in the storage memory cell of one of the storage words. A charge determined by each of a plurality of predetermined reference values is also stored in a corresponding one of each of the reference memory cells. The present invention can utilize EEPROM or DRAM cells for the memory cells.

DETAILED DESCRIPTION OF THE INVENTION

Figure 1:
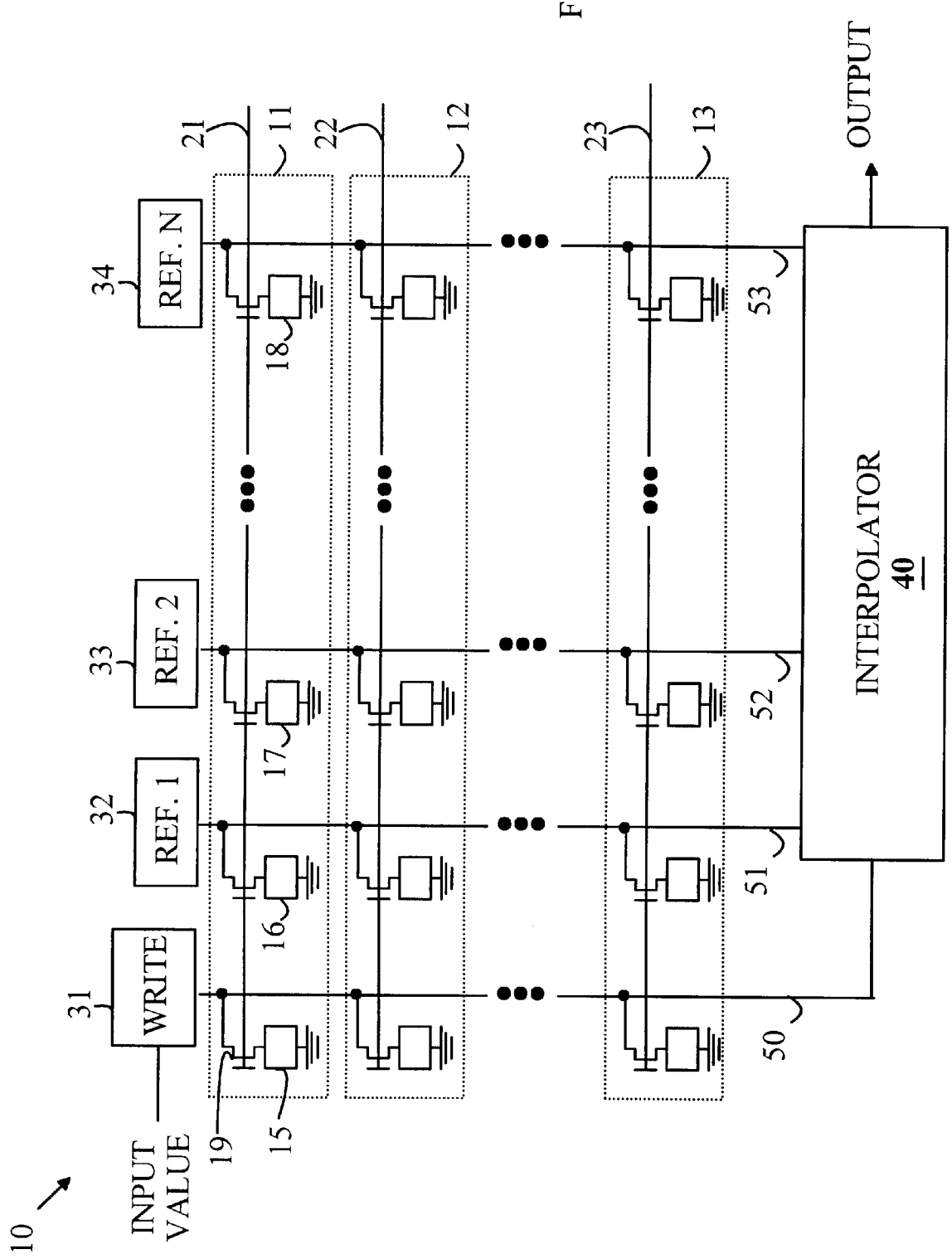
FIG. 1 is a block diagram of a memory 10 according to the present invention.

The manner in which the present invention gains its advantages may be more easily understood with reference to FIG. 1 which is a block diagram of a memory 10 according to the present invention. Memory 10 is divided into storage words, exemplary storage words being shown at 11–13. Each storage word is constructed from one or more data memory cells and a plurality of reference memory cells. To simplify the following discussion, it will be assumed that each storage word only contains one data memory cell; however, embodiments having multiple data storage cells will be apparent to those skilled in the art from the following discussion. Each memory cell has an isolation transistor and charge storage element. The charge storage elements for the memory cells shown in storage word 11 are shown at 15–18. The isolation transistor in the memory cell containing storage element 15 is shown at 19. Each charge storage element stores a charge that determines the conductivity measure between first and second terminals on the storage element. The isolation transistor connects the first terminal to a data line. The second terminal is shown connected to ground in the figure. Exemplary data lines are shown at 50–53. The data lines connected to the reference memory cells will be referred to as reference lines in the following discussion. While the data line and reference lines are shown as single conductors in the drawing, it is to be understood that each of the lines may have separate conductors for writing and reading depending on the type of charge storage element that is used. If separate read and write conductors are utilized, multiple isolation transistors are also utilized.

A data value is written into a storage word by connecting the charge storage elements of that word to the corresponding data and reference lines. A word line is used to place the relevant isolation transistors in the conducting state. Exemplary word lines are shown at 21–23. If multiple isolation transistors are utilized in each memory cell, there will be corresponding conductors in the word lines. The data value is converted from a digital value to an analog value by a write circuit 31 that causes a charge corresponding to that analog value to be stored in the data storage element of the selected word. At the same time, reference write circuits 32–34 cause predetermined reference values to be stored in the storage elements of the reference storage elements. Since the reference values are stored at the same time as the data values, all of the charge storage elements will begin to "leak" charge at the same time. As noted above, the amount of charge that leaks off of each storage element depends on the initial value of the charge in that storage element. Hence, the storage memory cells provide a calibration curve for the storage word in which they reside.

The value stored in the data memory cell in a storage word is computed by comparing the conductivity of that memory cell with the reference curve specified by the conductivities of the reference storage elements at the time of the read operation. The various conductivities are measured by an interpolation circuit 40 that preferably constructs a piecewise linear calibration curve relating the conductivities to the known reference values. The data value can then be "read" off of this calibration curve and outputted.

Figure 2:
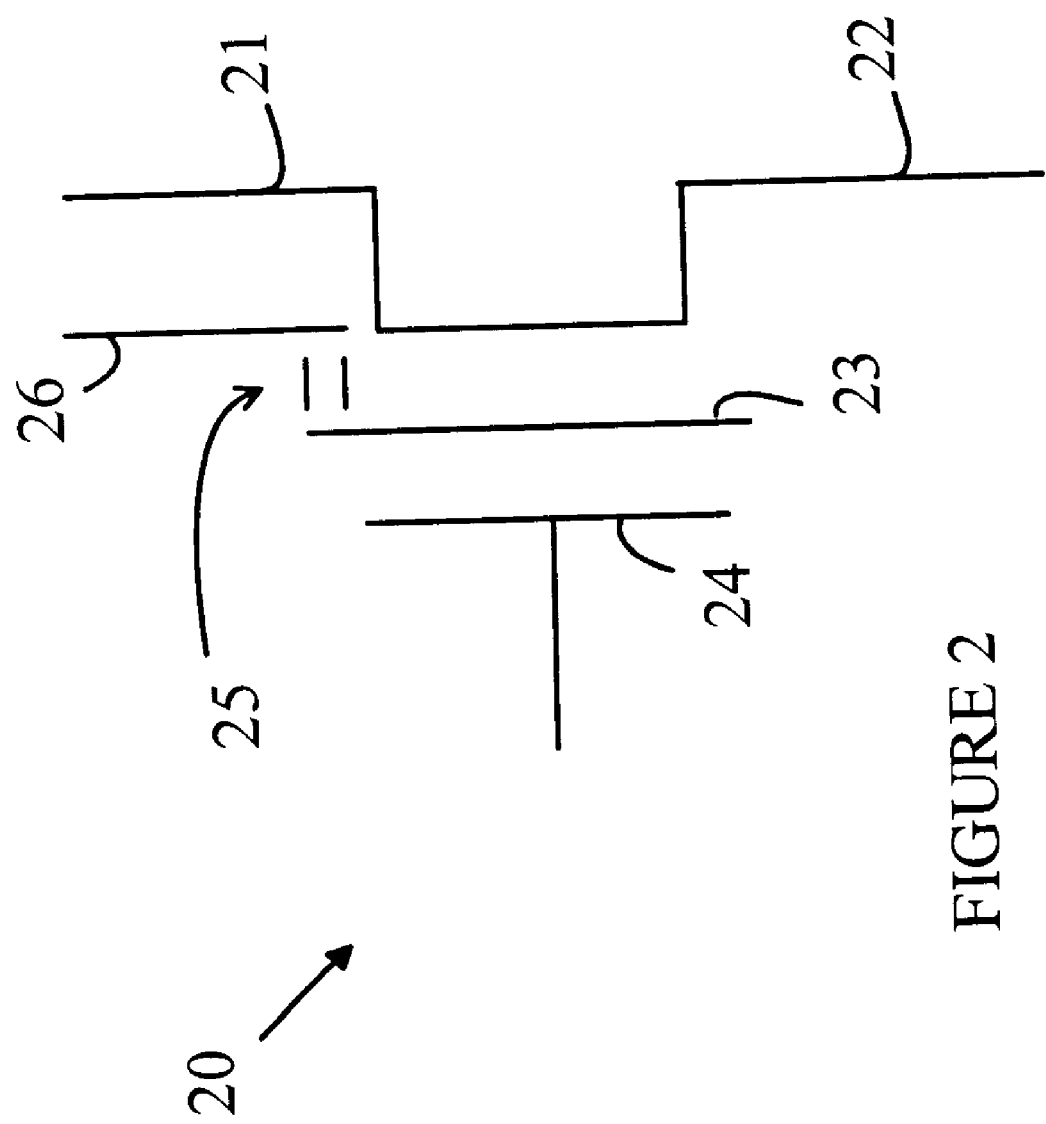
FIG. 2 is a schematic drawing of an EEPROM cell 20.

There are a number of examples of storage cells based on EEPROM technology. For the purposes of this discussion, an EEPROM is any transistor in which the conductivity between the source and drain of the transistor is determined by charge stored on a floating gate. An example of an EEPROM memory cell that can be used in the present invention is shown in FIG. 2, which is a schematic drawing of an EEPROM cell 20. EEPROM 20 has a floating gate 23 that controls the conductivity of the channel between a source 22 and a drain 21. Charge is moved to and from the floating gate via a tunneling window 25 utilizing a separate programming electrode 26 to apply the programming voltage. The capacitive coupling of programming electrode 26 to the floating gate is selected to be a small fraction of the capacitive coupling between floating gate 23 and programming gate 24.

Programming electrode 26 only needs to overlie the floating gate over the small region in which the tunneling window is created. Accordingly, the capacitive coupling between programming electrode 26 and floating gate 23 is much smaller than that between the channel and the floating gate. In addition, this capacitance is much smaller than the capacitance between floating gate 23 and programming gate 24. Denote the capacitance between floating gate 23 and programming electrode 26 by $C_{if}$ and the capacitance between floating gate 23 and programming gate 24 by $C_{pf}$.

Consider a programming operation in which the potential of programming electrode 26 is V and the programming gate is held at ground. Since the $C_{pf} \gg C_{if}$, essentially all of the potential difference will appear between floating gate 23 and programming electrode 26. That is, floating gate 23 will remain essentially at ground. This provides two benefits. First, the voltage needed to program EEPROM 20 is reduced from the values normally needed, since all of the potential is used to drive charge through the tunneling window. Second, the programming voltage does not disturb the potential on the floating gate; hence, the conductivity of the channel reflects the amount of charge currently on the floating gate, not the programming voltage.

It should also be noted that this arrangement frees the source and drain of EEPROM 20 during programming. Accordingly, these terminals can be connected to a circuit that continuously measures the current flowing through the channel. When the current reaches the desired level, the programming voltage is turned off.

To erase EEPROM 20 programming, gate 24 is raised to an elevated voltage while programming electrode 26 is held near ground. Floating gate 23 is then left with a net negative charge referenced to the substrate. It should be noted that the fraction of the erase potential that appears on the floating gate is roughly equal to half of the erase potential, since this voltage is being split capacitively based on the sum of the $C_{if}$ and $C_{ic}$, and the capacitive coupling between the channel and the floating gate.

Figure 3:
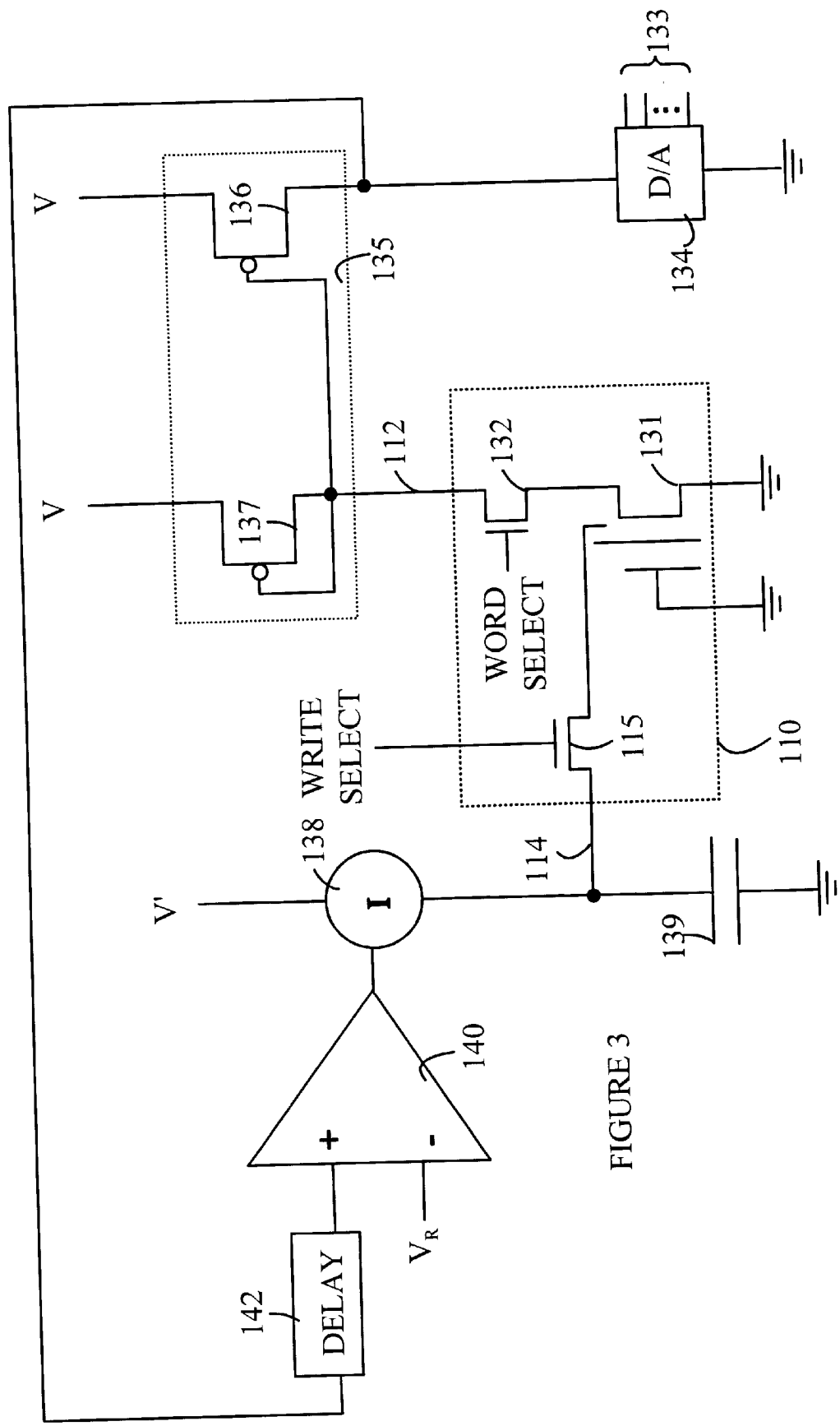
FIG. 3 is a schematic drawing of one embodiment of a write circuit connected to a memory cell 110 according to the present invention.

The manner in which the EEPROM is programmed as part of a memory can be more easily understood with reference to FIG. 3, which is a schematic drawing of one embodiment of a write circuit connected to a memory cell 110 according to the present invention. Memory cell 110 includes two isolation transistors shown at 115 and 132, and an EEPROM 131, which serves the function of the storage element. The other memory cells in the memory have been omitted to simplify the drawing. In memory embodiments utilizing this form of EEPROM cell, the data lines discussed above have two conductors, shown at 112 and 114. The second isolation transistor 115 is used to connect the write electrode to the programming circuitry and is controlled by a write select conductor that is included in the word select line.

The manner in which the EEPROM is programmed will now be explained in more detail. It is assumed that select transistor 132 is conducting. The multi-bit data value to be programmed into EEPROM 131 is presented on the input lines 133 of a current-based digital to analog converter 134. D/A 134 sets the current that flows through one transistor 136 of a current mirror 135. The other transistor 137 is connected to EEPROM 131. A switchable current source 138 and capacitor 139 generate a ramp that is applied to the programming electrode of EEPROM 131. The slope of the ramp is preferably set such that the potential on the floating gate remains close to that on the programming electrode. When the current flowing through EEPROM 131 reaches a value corresponding to that flowing through D/A 134, comparator 140 switches current source 138 off, and the programming is complete. The reference memory cells are programmed in the same manner, but with fixed predetermined values. Hence, the D/A converter can be replaced with a fixed voltage reference in the reference programming circuitry.

While the capacitive coupling between the programming electrode and the floating gate is very small, it is not zero. This results in a small error in the programming of the EEPROM. In effect, comparator 140 "sees" a higher current flowing through EEPROM 131 than will be flowing when the write select is turned off. Whether or not this error is significant depends on the number of bits being stored in EEPROM 131. A first order correction can be applied to correct this error by inserting a delay 142 between current mirror 135 and comparator 140. This delay causes the programming circuit to overshoot since comparator 140 will be acting on the current produced by a lower programming voltage than is currently being applied to EEPROM 131. By adjusting this delay, the error described above can be substantially reduced.

Figure 4:
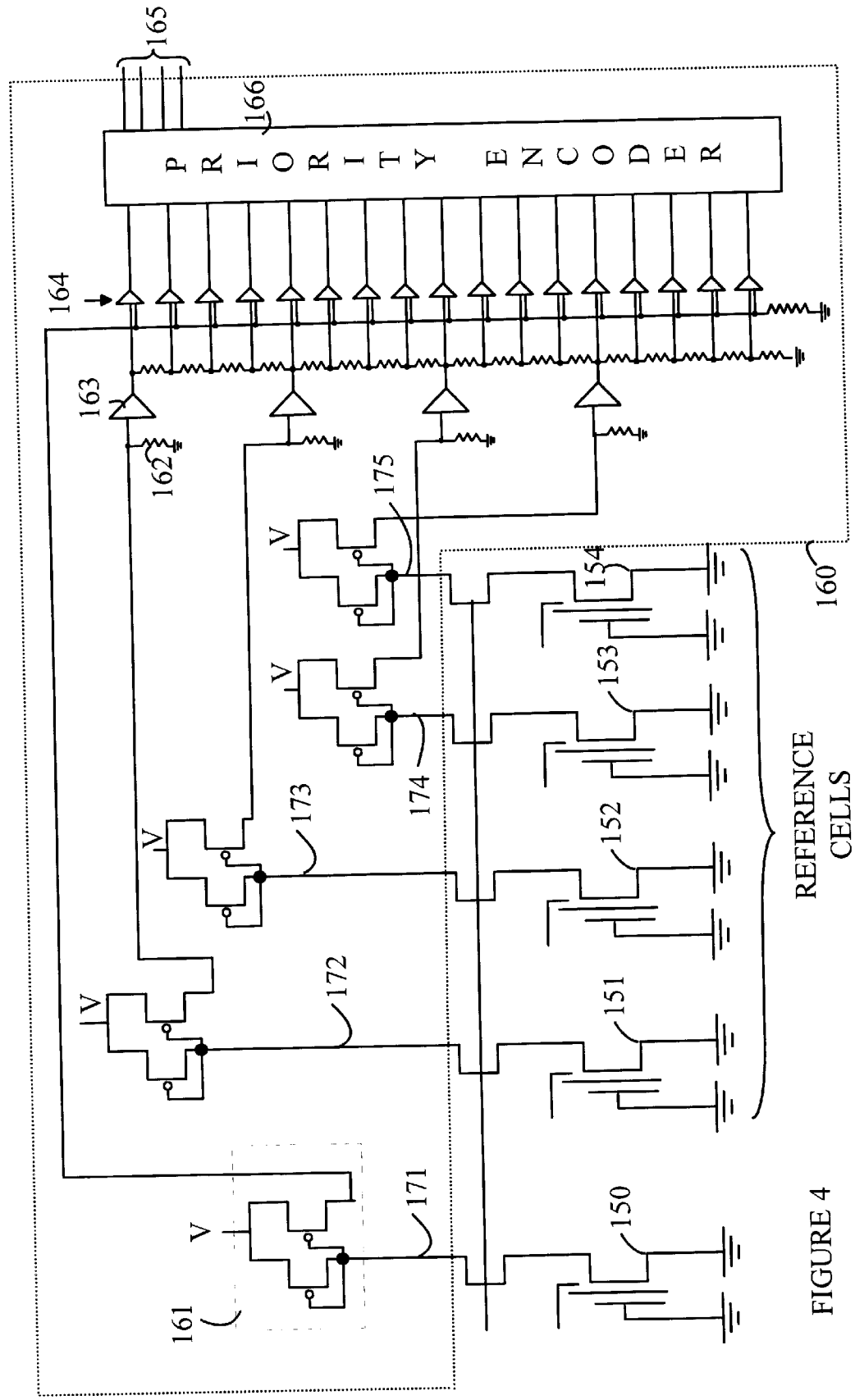
FIG. 4 is an example of an interpolation circuit for reading an EEPROM memory cell shown at 160 together with one storage word.

An example of an interpolation circuit for reading an EEPROM memory cell is shown in FIG. 4 at 160 together with one storage word. The remaining storage words have been omitted to simplify the drawing. The storage word shown in the figure consists of a data storage memory cell having a storage element 150 and 4 reference memory cells that utilize EEPROMs 151–154. The data lines are shown at 171–175. As noted above, the memory cells of any given storage word are read and written in parallel. Each storage word also includes a plurality of reference memory cells that are written at the same time as the memory cells that actually store the data. Each reference cell is programmed with a different value such that the set of reference cells stores values between the minimum and maximum values that can be stored in EEPROM cell 150. To simplify the following discussion, it will be assumed that each EEPROM cell stores 4 bits. In this case, reference cell 151 is programmed with 1111, reference cell 152 with 1011, reference cell 153 with 0111, and reference cell 154 with 0011.

The read circuit converts the conductance of each EEPROM cell into a current with the aid of a current mirror. A typical current mirror is shown at 161. The current from EEPROM 150 is then compared to 16 points taken on a piecewise linear curve having four non-linear points defined by reference cells 151–154. The comparison is accomplished by converting each of the currents from the current mirrors to a voltage by passing the current through a resistor such as resistor 162. The resulting voltage is applied to a string of 4 resistors via a unity gain drive circuit 163 to provide four points on the linear curve. The 15 points are compared to the voltage generated by the current mirror on EEPROM 150 by 15 comparators shown at 164. The results of the comparisons are decoded by a priority encoder 166 to produce the output value 165.

Figure 5:
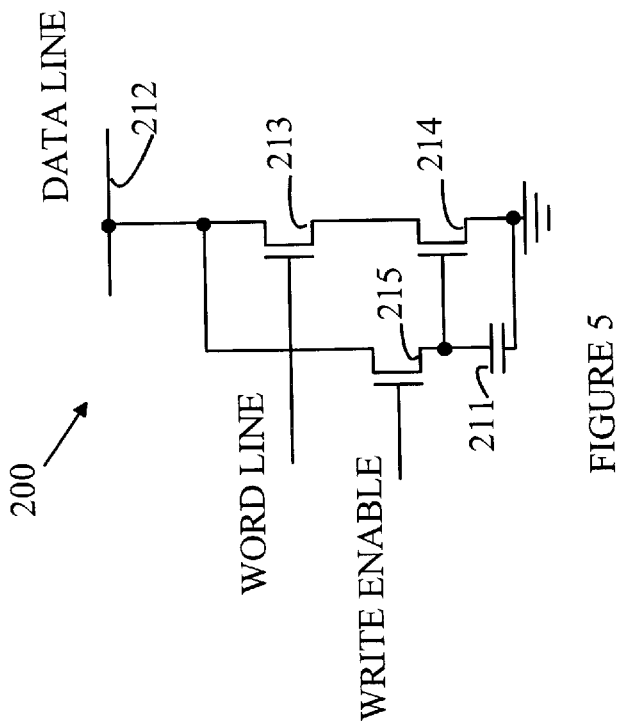
FIG. 5 is a schematic drawing of a DRAM storage cell 200.

There are a number of examples of storage cells based on DRAM technology. For the purposes of this discussion, a DRAM is any transistor in which the conductivity between the source and drain of the transistor is determined by charge stored on a capacitor connected to the gate of the transistor. Refer now to FIG. 5 which is a schematic drawing of a DRAM storage cell 200. Storage cell 200 stores an analog value by storing charge on a capacitor 211. In general, the data to be stored or written is presented as an analog current on a data line 212. Select transistor 213 connects storage cell 200 to the data line. The current sinked by storage cell 200 depends on the charge stored on capacitor 211. Data is written into capacitor 211 by connecting capacitor 211 to the data line via gate 215.

Figure 6:
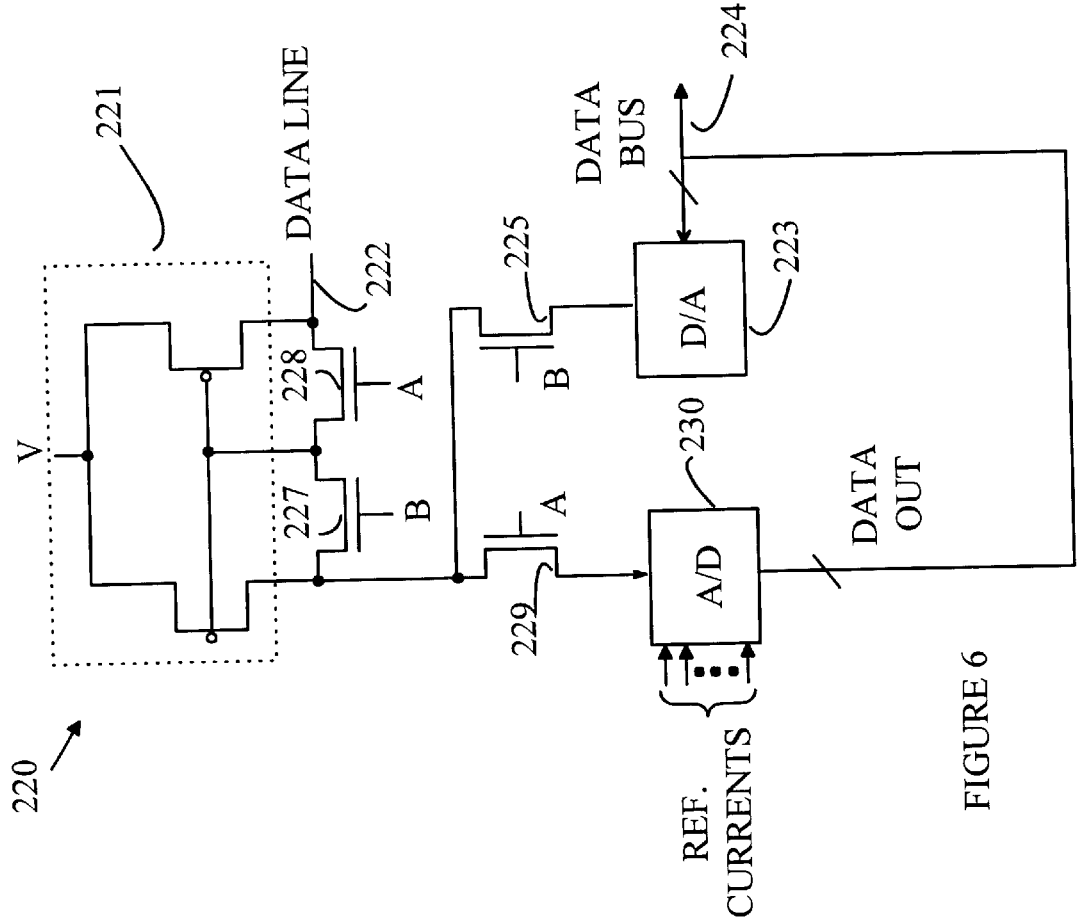
FIG. 6 is a schematic drawing of an encode/decode circuit 220 according to the present invention.

The manner in which a multi-bit data value is stored in storage cell 200 may be more easily understood with reference to FIG. 6 which is a schematic drawing of an encode/decode circuit 220 according to the present invention. To write data into a storage cell connected to a data line 222, circuit 220 utilizes a current mirror 221 to generate a current in data line 222 that is proportional to the multi-bit digital value on data bus 224. A current based digital to analog converter 223 converts the digital value to an analog current that is coupled to current mirror 221 through gate 225. During a write, gates 225 and 227 are conducting and gates 228 and 229 are non-conducting. The current generated by the D/A is thus transferred to data line 222 and a charge sufficient to cause the corresponding storage cell to sink that current is stored on the capacitor in the storage cell.

Data is read from a storage cell by a process analogous to that discussed above. During a read, gates 228 and 229 are conducting while gates 225 and 227 are non-conducting. The data storage word has its data storage element connected to data line 222. Current mirror 221 causes a current proportional to that being sinked by the storage cell to flow in current based A/D 230 which digitizes the current with reference to a number of reference currents that are generated by similar read circuits from the reference storage elements in the storage word. A/D converter 230 is similar to circuit 160 shown in FIG. 4 and discussed above.

Various modifications to the present invention will become apparent to those skilled in the art from the foregoing description and accompanying drawings. Accordingly, the present invention is to be limited solely by the scope of the following claims.

What is claimed is:

1. A memory comprising a plurality of storage words, a data line and a plurality of reference lines, and a read circuit, each storage word comprising a data memory cell and a plurality of reference memory cells, each memory cell comprising an isolation transistor and a storage element having first and second terminals for storing a charge, said charge determining a conductivity value measurable between said first and second terminals, said isolation transistor being connected to said first terminal and connecting said first terminal to one of said lines, said first terminal of said data memory cell being connected to said data line and said first terminal of each of said reference memory cells being coupled to a corresponding one of said reference lines when said isolation transistors are in a conducting state, said isolation transistors being placed in said conducting state by a signal on a word line connected to each of said isolation transistors in said storage word, and said read circuit generating a digital value by comparing the conductivity of said data line with a continuous conductivity curve determined by the conductivities of said reference lines.

2. The memory of claim 1 wherein said conductivity curve is a piece-wise linear curve, having linear segments determined by said conductivities of said reference lines.

3. The memory of claim 1 further comprising a write circuit for causing a charge determined by an input digital value to be stored in said storage memory cell of one of said storage words, and a charge determined by each of a plurality of predetermined reference values to be stored in a corresponding one of each of said reference memory cells.

4. The memory of claim 1 wherein said memory cells comprise EEPROM cells.

5. The memory of claim 1 wherein said memory cells comprise DRAM memory cells.

6. A method for storing and retrieving a multi-level data value, said method comprising the steps of:

causing a charge representative of said data value to be stored in a data memory cell having first and second terminals, and a charge storage element for storing said charge, said stored charge determining a conductivity value measured between said first and second terminals;

causing each of a plurality of predetermined charges to be stored in a corresponding one of a plurality of reference memory cells, each memory cell having first and second terminals, and a charge storage element for storing said charge, said stored charge determining a conductivity value measured between said first and second terminals of that reference memory cell.

7. The method of claim 6 further comprising the steps of:

comparing said conductivity between said first and second terminals of said data memory cell with a continuous conductivity curve determined by said conductivities between said first and second terminals of each of said reference memory cells.

8. The method of claim 7 wherein said conductivity curve is a piece-wise linear curve, having linear segments determined by said conductivities of said reference memory cells.

* * * * *